United States Patent
Lind

(10) Patent No.: US 11,079,779 B2
(45) Date of Patent: *Aug. 3, 2021

(54) TRANSCONDUCTOR SYSTEM FOR A POWER SUPPLY SYSTEM

(71) Applicant: Texas Instruments Incorporated, Dallas, TX (US)

(72) Inventor: Ryan Erik Lind, Knoxville, TN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/540,808

(22) Filed: Aug. 14, 2019

(65) Prior Publication Data

US 2019/0372536 A1 Dec. 5, 2019

Related U.S. Application Data

(63) Continuation of application No. 16/228,926, filed on Dec. 21, 2018, now Pat. No. 10,432,157, which is a (Continued)

(51) Int. Cl.
*H03F 1/46* (2006.01)
*G05F 1/46* (2006.01)
(Continued)

(52) U.S. Cl.
CPC .............. *G05F 1/461* (2013.01); *G05F 1/561* (2013.01); *G05F 1/575* (2013.01); *H02M 1/00* (2013.01);
(Continued)

(58) Field of Classification Search
CPC ............. H03F 3/45237; H03F 3/45183; H03F 1/0238; H03F 3/45273; H03F 2203/45288;
(Continued)

(56) References Cited

U.S. PATENT DOCUMENTS 5,815,012 A * 9/1998 Rivoir .................... G05F 1/561
327/103
6,316,970 B1 11/2001 Hebert
(Continued)

FOREIGN PATENT DOCUMENTS

EP 2284990 A2 2/2011
RU 2079965 C1 5/1997

OTHER PUBLICATIONS

Search Report for PCT Application No. PCT/US 2018/059923, date of mailing of international search report dated Apr. 11, 2019, 1 page.

*Primary Examiner* — Alex Torres-Rivera
(74) *Attorney, Agent, or Firm* — Lawrence J. Bassuk; Charles A. Brill; Frank D. Cimino

(57) ABSTRACT

One example includes a transconductor system. The system includes a first transconductance amplifier that generates a control current in response to a first input voltage. The system also includes a second transconductance amplifier that generates an output signal in response to a second input voltage. The system further includes an intermediate amplifier that generates a control voltage in response to the control current and a third input voltage. The control voltage can be provided to the first and second transconductance amplifiers to set a transconductance of each of the first and second transconductance amplifiers to be approximately equal.

34 Claims, 2 Drawing Sheets

Related U.S. Application Data continuation of application No. 15/808,002, filed on Nov. 9, 2017, now Pat. No. 10,199,999.

(51) Int. Cl.

| | | |
|---|---|---|
| *H03F 3/45* | (2006.01) | |
| *H03F 1/02* | (2006.01) | |
| *H02M 1/00* | (2006.01) | |
| *G05F 1/575* | (2006.01) | |
| *G05F 1/56* | (2006.01) | |
| *H02M 3/04* | (2006.01) | |
| *H02M 7/04* | (2006.01) | |

(52) U.S. Cl.
CPC ............... *H02M 3/04* (2013.01); *H02M 7/04* (2013.01); *H03F 1/0238* (2013.01); *H03F 3/45183* (2013.01); *H03F 3/45237* (2013.01); *H03F 3/45273* (2013.01); *H02M 2001/007* (2013.01); *H02M 2001/0009* (2013.01); *H02M 2001/0045* (2013.01); *H03F 2200/462* (2013.01); *H03F 2203/45288* (2013.01)

(58) Field of Classification Search
CPC ............. H03F 2200/462; H03F 1/0205; H03F 3/45179; H03F 3/45475; H03F 1/26; G05F 1/575; G05F 1/461; G05F 1/561; G05F 3/267; G05F 1/46; G05F 3/262; H02M 3/04; H02M 7/04; H02M 1/00; H02M 2001/0045; H02M 2001/007; H02M 2001/0009; H02M 3/156; H02M 3/158; G01R 31/013; H03G 1/0029

See application file for complete search history.

(56) References Cited

U.S. PATENT DOCUMENTS

| | | | | |
|---|---|---|---|---|
| 7,385,442 | B1* | 6/2008 | Ripley | H03F 3/4508 |
| | | | | 327/124 |
| 7,843,180 | B1* | 11/2010 | Cilingiroglu | G05F 1/575 |
| | | | | 323/274 |
| 8,164,383 | B1* | 4/2012 | Lollio | H03F 1/3205 |
| | | | | 330/51 |
| 10,199,999 | B1 | 2/2019 | Lind | |
| 2006/0049811 | A1 | 3/2006 | Farkas | |
| 2009/0066301 | A1* | 3/2009 | Oswald | H02M 3/1582 |
| | | | | 323/271 |
| 2010/0019697 | A1* | 1/2010 | Korsunsky | H05B 45/10 |
| | | | | 315/307 |
| 2013/0187620 | A1* | 7/2013 | Parkhurst | H03F 1/342 |
| | | | | 323/234 |
| 2014/0091780 | A1 | 4/2014 | Hu | |
| 2015/0069982 | A1* | 3/2015 | Ouyang | H02M 3/156 |
| | | | | 323/234 |
| 2015/0077073 | A1* | 3/2015 | Yu | H02M 3/1584 |
| | | | | 323/271 |
| 2017/0272036 | A1* | 9/2017 | Wu | H03F 3/72 |
| 2018/0131336 | A1* | 5/2018 | Kwak | H03F 1/342 |

* cited by examiner

TRANSCONDUCTOR SYSTEM FOR A POWER SUPPLY SYSTEM

CROSS REFERENCE TO RELATED APPLICATIONS

Under 35 U.S.C. § 120, this continuation application claims benefits of and priority to U.S. patent application Ser. No. 16/228,926, filed on Dec. 21, 2018, now U.S. Pat. No. 10,432,157, issued Oct. 1, 2019, which is a continuation application of U.S. patent application Ser. No. 15/808,002, filed on Nov. 9, 2017, now U.S. Pat. No. 10,199,999, issued Feb. 5, 2019, the entirety of which are hereby incorporated herein by reference.

TECHNICAL FIELD

This disclosure relates generally to electronic systems, and more specifically to a transconductor system.

BACKGROUND

A transconductor (e.g., transconductance amplifier) is a circuit device that converts an input signal (e.g., an input voltage) to an output signal (e.g., an output current). A transconductor can have a transconductance that defines a gain of the transconductor, such that the transconductance can define an amplitude of the output signal in response to the input signal. Transconductors can be implemented in a variety of circuit applications, such as in power supply systems. For example, a given power supply system can generate an output voltage based on an input voltage, with both the input and output voltages being potentially highly variable. For a buck converter, as an example, the input voltage can be greater than the output voltage. The power supply system can include an input-current control loop and a differential current balancing loop (e.g., dual-phase) that can exhibit a loop gain that can have a dependence on the input voltage and/or the output voltage. The loop gain can also be affected by a response time, such as in response to transient changes to the input voltage and/or the output voltage, and can also be affected by a bandwidth of the respective amplitudes of the input voltage and/or the output voltage.

SUMMARY

One example includes a transconductor system. The system includes a first transconductance amplifier that generates a control current in response to a first input voltage. The system also includes a second transconductance amplifier that generates an output signal in response to a second input voltage. The system further includes an intermediate amplifier that generates a control voltage in response to the control current and a third input voltage. The control voltage can be provided to the first and second transconductance amplifiers to set a transconductance of each of the first and second transconductance amplifiers to be approximately equal.

Another example includes a transconductor system. The system includes a first transconductance amplifier that generates a control current in response to a first input voltage and a second transconductance amplifier that generates an output signal in response to a second input voltage. The system also includes an intermediate amplifier that generates a control voltage in response to the control current and a third input voltage. The control voltage can be provided to the first and second transconductance amplifiers to set a transconductance of the transconductor system to be proportional to a ratio of the third input voltage and the first input voltage.

Another example includes a power regulator system. The system includes a rectifier that converts an AC input voltage to an input voltage and a buck regulator that generates an output voltage in response to a power regulation signal. The system further includes a transconductor system that generates the regulation signal in response to the input voltage and the output voltage. The transconductor system can have a transconductance that is proportional to a ratio of the input voltage and the output voltage.

DETAILED DESCRIPTION

Figure 1:
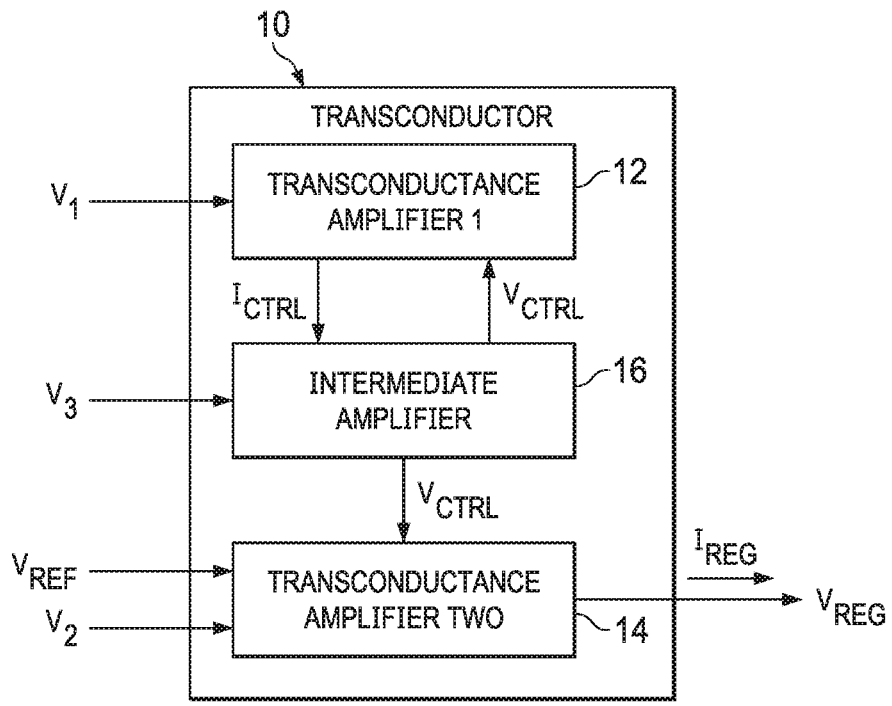
FIG. 1 illustrates an example of a transconductor system.

This disclosure relates generally to electronic systems, and more specifically to a transconductor system. The transconductor system can be configured to generate an output signal in response to a set of input signals. The transconductor system can include a first transconductance amplifier that is configured to generate a control current in response to a first input voltage. As an example, the first input voltage can correspond to an output voltage that is provided from a buck converter in a power supply system that includes the transconductor. The output voltage can thus be provided to the first transconductance amplifier via a voltage divider to provide a pair of inputs to the first transconductance amplifier. The transconductor system can also include a second transconductance amplifier that is configured to generate an output signal in response to a second input voltage. As an example, the second input voltage can correspond to a current monitoring voltage corresponding to an amplitude of an input current associated with an input voltage that is provided to the power supply system that includes the transconductor, such as from a rectifier. The current monitoring voltage can thus be provided to the second transconductance amplifier along with a predetermined reference voltage corresponding to a current amplitude to which the amplitude of the input current is desired to be regulated.

The transconductor system further includes an intermediate amplifier that can correspond to a voltage amplifier that is configured to generate a control voltage in response to the control current and a third input voltage. As an example, the third input voltage can correspond to the input voltage that is provided to the power supply system. The control voltage can thus be provided to each of the first and second transconductance amplifiers to control a transconductance of each of the first and second transconductance amplifiers. As an example, the first and second transconductance amplifiers can be fabricated from fabrication-matched components (e.g., with respect to associated transistors), such that the control voltage can set the transconductance of the first and second transconductance amplifiers to be approximately equal. The second transconductance amplifier can generate a regulation output signal that can be provided to a power regulator (e.g., a buck regulator), such that the transconductor system can have a transconductance that is proportional to a ratio of the input voltage (e.g., the third input voltage) and the output voltage (e.g., the first input voltage) to regulate the amplitude of the input current. Accordingly, the control loop of the power regulator system, having a loop gain that is proportional to a ratio of the output voltage and the input voltage, can be controlled via the transconductor system, having a transconductance that is proportional to a ratio of the input voltage and the output voltage, to provide power regulation that is absent a dependence on the amplitude of the input voltage or the output voltage.

FIG. 1 illustrates an example of a transconductor system 10. The transconductor system 10 can be implemented in any of a variety of circuit applications that require converting a voltage to an output signal, such as an output current. In the example of FIG. 1, the transconductor system 10 generates a regulation output signal, which is demonstrated as a current $I_{REG}$ which can create a voltage $V_{REG}$. As an example, the transconductor system 10 can be implemented in a power supply system (e.g., a buck power supply system), such as for charging a battery of an electronic device.

The transconductor system 10 includes a first transconductance amplifier 12, a second transconductance amplifier 14, and an intermediate amplifier 16. The first transconductance amplifier 12 is configured to generate a control current $I_{CTRL}$ in response to a first input voltage $V_1$. As an example, the first input voltage $V_1$ can correspond to an output voltage that is provided from a buck converter in a power supply system that includes the transconductor system 10. For example, the first input voltage $V_1$ can be provided to the first transconductance amplifier 12 via a voltage divider (not shown) to provide two proportional voltages that are associated with the first input voltage $V_1$.

The second transconductance amplifier 14 is configured to generate the current $I_{REG}$ in response to a second input voltage $V_2$, and in response to the predetermined reference voltage $V_{REF}$. As an example, the second input voltage $V_2$ can correspond to a current monitoring voltage associated with an amplitude of a current associated with a third input voltage $V_3$ that can correspond to an input voltage that is provided to the associated power supply system (e.g., from a rectifier). The predetermined reference voltage $V_{REF}$ can correspond to a current amplitude to which the amplitude of the input current (e.g., of the third input voltage $V_3$) is desired to be regulated. Therefore, the second transconductance amplifier 14 can generate the current $I_{REG}$ which can create the voltage $V_{REG}$ based on an amplitude difference between the second input voltage $V_2$ and the predetermined reference voltage $V_{REF}$.

The intermediate amplifier 16 can be configured as a voltage amplifier that is configured to generate a control voltage $V_{CTRL}$ in response to the control current $I_{CTRL}$ and in response to the third input voltage $V_3$ that can correspond to the input voltage of the associated power supply system. In the example of FIG. 1, the control voltage $V_{CTRL}$ is provided to each of the first and second transconductance amplifiers 12 and 14 to control a respective transconductance of each of the first and second transconductance amplifiers 12 and 14. As an example, the first and second transconductance amplifiers 12 and 14 can be fabricated from respective fabrication-matched components (e.g., with respect to associated transistors, such as including differential pairs), such that the control voltage $V_{CTRL}$ can set the transconductance of the first and second transconductance amplifiers 12 and 14 to be approximately equal. For example, the first transconductance amplifier 12 and the intermediate amplifier 16 can be configured in a feedback arrangement, such that the amplitude of the control voltage $V_{CTRL}$ is adjusted to regulate the control current $I_{CTRL}$ relative to the third input voltage $V_3$. The adjustment of the control voltage $V_{CTRL}$ can thus set the transconductance of the second transconductance amplifier 14 to be approximately equal to the first transconductance amplifier 12, such that the second transconductance amplifier 14 can generate the voltage $V_{REG}$ based on the second input voltage $V_2$ relative to the predetermined reference voltage $V_{REF}$ and based on the transconductance of the first and second transconductance amplifiers 12 and 14.

Based on the operation of the transconductor system 10, the transconductor system 10 can have a transconductance that is proportional to a ratio of the first input voltage $V_1$ and the third input voltage $V_3$. As described previously, the power regulation voltage $V_{REG}$ that can be provided to a power regulator (e.g., a buck regulator) that can have a control loop that is proportional to a ratio of an output voltage and an input voltage. By providing the third input voltage $V_3$ as the input voltage from the buck power regulator, and by providing the first input voltage $V_1$ as the output voltage that is provided to the power regulator system (e.g., from a rectifier), the control loop of the power regulator system can provide power regulation that is absent a dependence on the amplitude of the input voltage or the output voltage of the power regulation system, as described herein.

Figure 2:
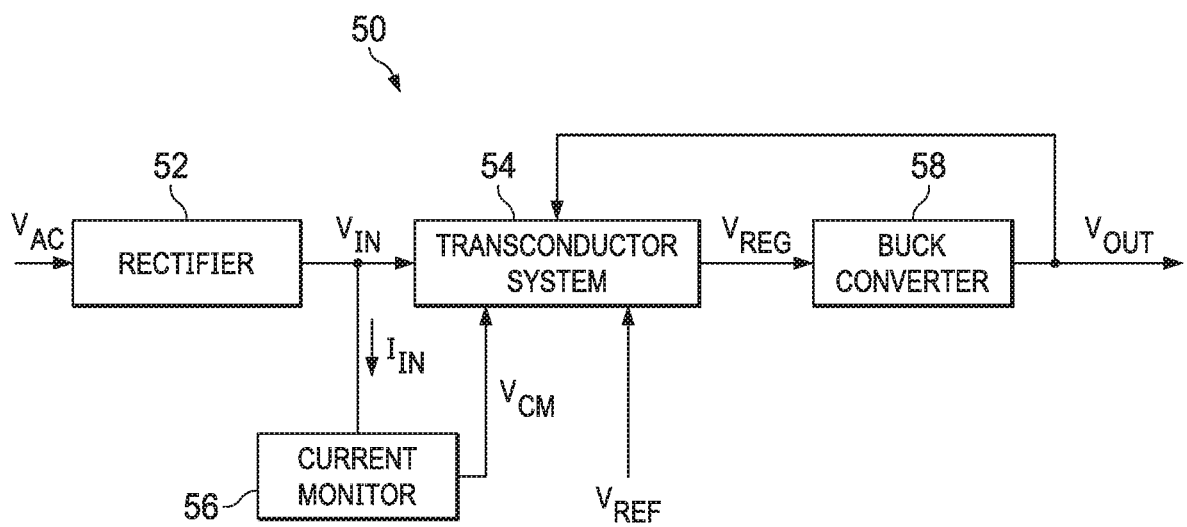
FIG. 2 illustrates an example of a power supply system.

FIG. 2 illustrates an example of a power supply system 50. The power supply system 50 can correspond to an AC-DC power supply system that is configured to convert an AC power voltage, demonstrated in the example of FIG. 2 as a voltage $V_{AC}$, into a DC power voltage, demonstrated in the example of FIG. 2 as an output voltage $V_{OUT}$. As an example, the power supply system 50 can be implemented in a charging circuit for charging a battery of a portable electronic device.

The power supply system 50 includes a rectifier 52 that is configured to rectify the AC input voltage $V_{AC}$ to generate a DC input voltage $V_{IN}$ (hereinafter "input voltage $V_{IN}$") having an input current $I_{IN}$. The rectifier 52 can also include a number of other power conditioning functions (e.g., filtering and/or step-down amplification) in addition to rectifying the AC input voltage $V_{AC}$ to generate the input voltage $V_{IN}$. The input voltage $V_{IN}$ is provided to a transconductor system 54 and to a current monitor 56. As an example, the current monitor 56 is configured to monitor an amplitude of the input current $I_{IN}$, and is thus configured to generate a monitoring voltage $V_{CM}$ that is provided to the transconductor system 54. The current monitoring voltage $V_{CM}$ can thus have an amplitude that is proportional to the input current $I_{IN}$.

The power supply system 50 further includes a buck converter 58 that is configured to generate an output voltage $V_{OUT}$ based on a power regulation voltage $V_{REG}$ that is generated by the transconductor system 54. The buck converter 58 can be configured as any of a variety of switching buck converters that is configured to provide the output voltage $V_{OUT}$ as a DC voltage at a lesser amplitude than the power regulation voltage $V_{REG}$. The output voltage $V_{OUT}$ is provided to the transconductor system 54 in a feedback manner, as described in greater detail herein.

The transconductor system 54 can be configured to regulate a current associated with the input voltage $V_{IN}$ based on providing the power regulation voltage $V_{REG}$. As an example, the transconductor system 54 can be configured substantially similar to the transconductor system 10 in the example of FIG. 1. For example, the first input voltage $V_1$ of the transconductor system 10 can correspond to the output voltage $V_{OUT}$ in the example of FIG. 2, and the third input voltage $V_3$ of the transconductor system 10 can correspond to the input voltage $V_{IN}$ in the example of FIG. 2. Therefore, the transconductor system 54 can be configured to provide the power regulation voltage $V_{REG}$ at a transconductance that is proportional to a ratio of the input voltage $V_{IN}$ and the output voltage $V_{OUT}$. Additionally, the second input voltage $V_2$ of the transconductor system 10 can correspond to the monitoring voltage $V_{CM}$, such that the transconductance can be set to provide the power regulation voltage $V_{REG}$ based on the amplitude of the current $I_{IN}$ based on the predetermined reference voltage $V_{REF}$, as described previously.

Figure 3:
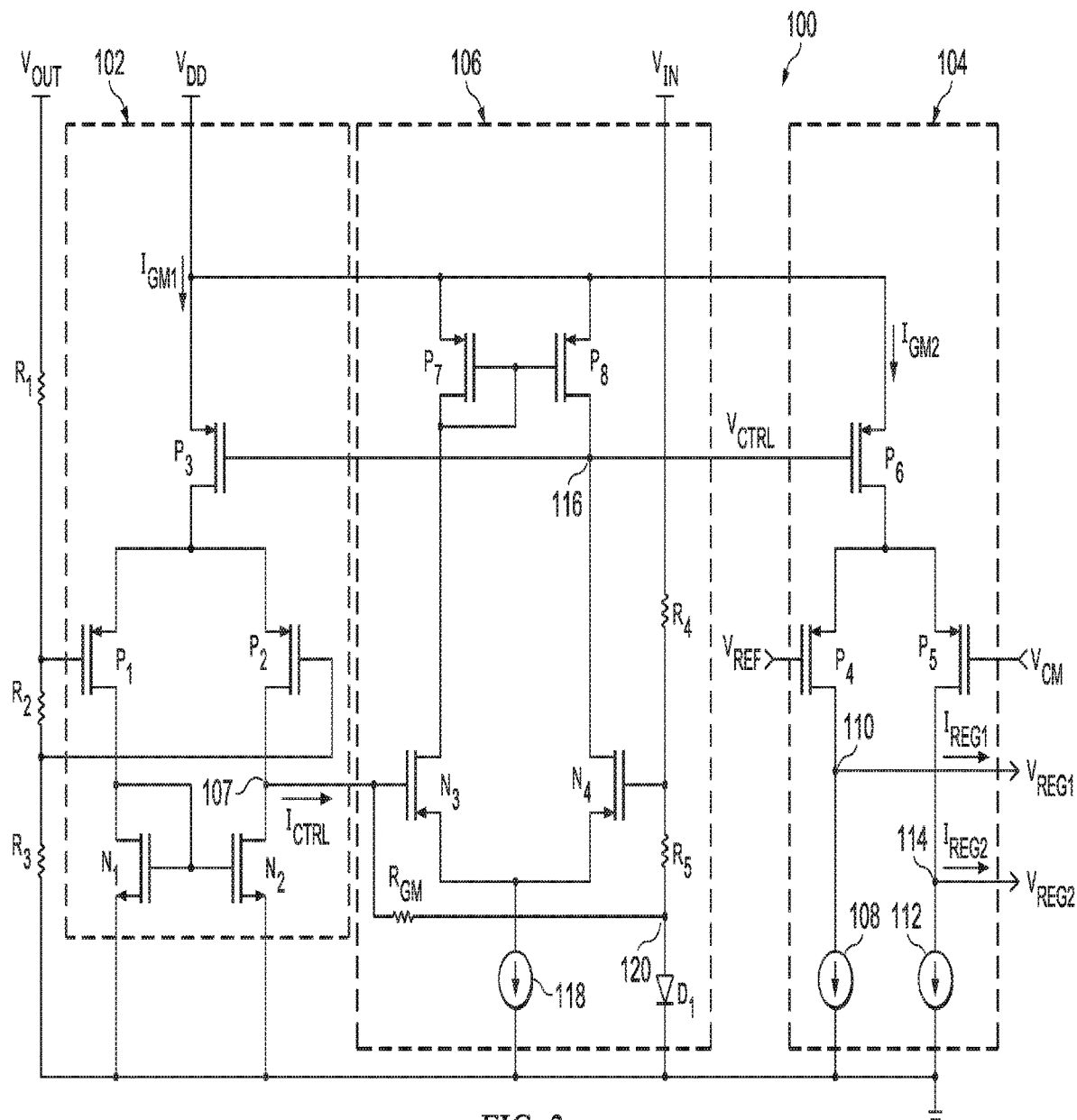
FIG. 3 illustrates an example of a transconductor circuit.

FIG. 3 illustrates an example of a transconductor circuit 100. The transconductor circuit 100 can be implemented in any of a variety of circuit applications that require converting a voltage to an output signal. In the example of FIG. 3, the transconductor circuit 100 generates a pair of regulation output currents $I_{REG1}$ and $I_{REG2}$ that can be converted to voltages $V_{REG1}$ and $V_{REG2}$ as a differential output signal. The transconductor circuit 100 can correspond to the transconductor system 54 in the example of FIG. 2. Therefore, reference is to be made to the example of FIG. 2 in the following description of the example of FIG. 3.

The transconductor circuit 100 includes a first transconductance amplifier 102, a second transconductance amplifier 104, and an intermediate amplifier 106. The first transconductance amplifier 102 is configured to generate a control current $I_{CTRL}$ in response to the output voltage $V_{OUT}$. In the example of FIG. 3, the output voltage $V_{OUT}$ is provided to a voltage-divider formed by a set of resistors $R_1$, $R_2$, and $R_3$. The voltage-divider provides a first divided voltage $V_{OUT1}$ between the resistors $R_1$ and $R_2$ and a second divided voltage $V_{OUT2}$ between the resistors $R_2$ and $R_3$, with the resistor $R_3$ being coupled to a low-voltage rail (e.g., ground). The first divided voltage $V_{OUT1}$ is provided to a gate of a P-channel metal-oxide semiconductor field-effect transistor (MOSFET, hereinafter "P-FET") $P_1$, and the second divided voltage $V_{OUT2}$ is provided to a gate of a P-FET $P_2$. The P-FETs $P_1$ and $P_2$ are arranged as a differential pair having a common source connection, with the P-FET $P_1$ being coupled to a diode-connected N-FET $N_1$ and the P-FET $P_2$ being coupled to an N-FET $N_2$ that has a common gate coupling to the N-FET $N_1$. The N-FETs $N_1$ and $N_2$ are coupled at a source to the low-voltage rail, with the N-FET $N_2$ having an output node 107 at the drain that provides the control current $I_{CTRL}$. In addition, the first transconductance amplifier 102 includes a control P-FET $P_3$ that interconnects the common source of the P-FETs $P_1$ and $P_2$ and a high rail voltage $V_{DD}$. As described in greater detail herein, the control P-FET $P_3$ is controlled to conduct a tail current $I_{GM1}$ that sets a transconductance of the first transconductance amplifier 102.

Based on the arrangement of the first transconductance amplifier 102, the first transconductance amplifier 102 is configured to generate the control current $I_{CTRL}$ based on the amplitude of the output voltage $V_{OUT}$ and based on a transconductance set by the tail current $I_{GM1}$. Based on the voltage-divider formed by the resistors $R_1$, $R_2$, and $R_3$, the divided voltages $V_{OUT1}$ and $V_{OUT2}$ each have an amplitude that is proportional to the amplitude of the output voltage $V_{OUT}$. Additionally, the first transconductor 102 has a transconductance (gm) that is variable based on the amplitude of the tail current $I_{GM1}$. Accordingly, the control current $I_{CTRL}$ has an amplitude that is based on the amplitude of the output voltage $V_{OUT}$ and the transconductance set by the tail current $I_{GM1}$.

The second transconductance amplifier 104 is configured to generate the regulation current $I_{REG1}$ and $I_{REG2}$ (which can be used to generate respective first and second regulation voltages $V_{REG1}$ and $V_{REG2}$) in response to the voltage $W_{CM}$. In the example of FIG. 3, the predetermined reference voltage $V_{REF}$ is provided to a gate of a P-FET $P_4$, and the voltage $V_{CM}$ is provided to a gate of a P-FET $P_5$. The P-FETs $P_4$ and $P_5$ are arranged as a differential pair having a common source connection, with the P-FET $P_4$ being coupled to a current source 108 that is interconnected by a first output node 110 on which the first regulation current $I_{REG1}$ (generating the first regulation voltage $V_{REG1}$) is provided, and the P-FET $P_5$ being coupled to a current source 112 that is interconnected by a second output node 114 on which the second regulation current $I_{REG2}$ (generating the second regulation voltage $V_{REG2}$) is provided. The current sources 108 and 112 interconnect the first and second output nodes 110 and 114 to the low-voltage rail. In addition, the second transconductance amplifier 104 includes a control P-FET $P_6$ that interconnects the common source of the P-FETs $P_4$ and $P_5$ and the high rail voltage $V_{DD}$. As described in greater detail herein, the control P-FET $P_6$ is controlled to conduct a tail current $I_{GM2}$ that sets a transconductance of the second transconductance amplifier 104.

Based on the arrangement of the second transconductance amplifier 104, the second transconductance amplifier 104 is configured to generate the first and second regulation currents $I_{REG1}$ and $I_{REG2}$ (generating the respective regulation voltages $V_{REG1}$ and $V_{REG2}$) based on the amplitude of the voltage $W_{CM}$ relative to the predetermined reference voltage $V_{REF}$ and based on a transconductance set by the tail current $I_{GM2}$. As described previously, the predetermined reference voltage $V_{REF}$ can correspond to a corresponding current amplitude to which the power supply system regulates the current $I_{IN}$, on which the amplitude of the voltage $W_{CM}$ is based. Additionally, the second transconductor 104 has a transconductance (gm) that is variable based on the amplitude of the tail current $I_{GM2}$. Accordingly, each of the regulation voltages $V_{REG1}$ and $V_{REG2}$ (e.g., the differential voltage $V_{REG}$) has an amplitude that is based on the amplitude of the voltage $W_{CM}$ relative to the predetermined reference voltage $V_{REF}$ and the transconductance set by the tail current $I_{GM2}$.

As an example, the circuit components of the first and second transconductance amplifiers 102 and 104 can be fabrication matched. As described herein, the term "fabrication matched" with respect to the circuit components can refer to circuit components that are fabricated as approximately identical with respect to size and/or electrical characteristics, and can be fabricated on the same wafer or same part of a wafer to provide for substantially similar fabrication, temperature, and tolerance characteristics and sensitivities. Therefore, the first and second transconductance amplifiers 102 and 104 can exhibit substantially identical performance characteristics. In addition, the P-FETs $P_3$ and $P_6$ can likewise be fabrication matched, such that the tail currents $I_{GM1}$ and $I_{GM2}$ can be approximately equal. Accordingly, the first and second transconductance amplifiers 102 and 104 can be controlled by approximately equal tail currents $I_{GM1}$ and $I_{GM2}$, respectively, to provide an approximately equal transconductance.

In the example of FIG. 3, the intermediate amplifier 106 is configured as a voltage amplifier that is configured to generate a control voltage $V_{CTRL}$ on a control node 116 that is provided to the gate of each of the P-FETs $P_3$ and $P_6$ to set an amplitude of the respective tail currents $I_{GM1}$ and $I_{GM2}$. The intermediate amplifier 106 includes a first N-FET $N_3$ and a second N-FET $N_4$ that are arranged as a differential pair having a common source connection that is coupled to a current source 118 that provides the differential current to the low-voltage rail. The N-FET $N_3$ is coupled to a diode-connected P-FET $P_7$ and the N-FET $N_4$ is coupled to a P-FET $P_8$ that has a common gate coupling to the P-FET $P_7$. The P-FETs $P_7$ and $P_8$ are coupled at a source to the high rail voltage $V_{DD}$, with the P-FET $P_8$ having a drain that is coupled to the node 116 on which the control voltage $V_{CTRL}$ is provided.

In the example of FIG. 3, the gate of the N-FET $N_3$ is coupled to the output node 107 on which the control current $I_{CTRL}$ is provided, and is also coupled to a resistor $R_{GM}$ that interconnects the output node 107 and a node 120. The gate of the N-FET $N_4$ is coupled to a first resistor $R_4$ and a second resistor $R_5$ that are arranged as a voltage-divider with respect to the input voltage $V_{IN}$ to provide a current $I_1$ through the resistor $R_4$, such that the gate of the N-FET $N_4$ is controlled by a voltage that is proportional to the input voltage $V_{IN}$. The resistor $R_5$ is coupled to the node 120, such that the node 120 interconnects the resistor $R_5$ and a diode D1 that has a cathode coupled to the low-voltage rail. Therefore, the differential pair of the N-FETs $N_3$ and $N_4$ is controlled by the control current $I_{CTRL}$ and the input voltage $V_{IN}$.

Particularly, in the example of FIG. 3, the control current $I_{CTRL}$ sets a voltage amplitude at the gate of the N-FET $N_3$ via the resistor $R_{GM}$, and the input voltage $V_{IN}$ sets a proportional voltage at the gate of the N-FET $N_4$ relative to a voltage at the node 120 that is based on the control current $I_{CTRL}$. Thus, the N-FETs $N_3$ and $N_4$ are operated as differential pair in the saturation mode of operation based on the input voltage $V_{IN}$ and the control current $I_{CTRL}$. In response, the intermediate amplifier 106 operates to substantially equalize the gate voltages of the N-FETs $N_3$ and $N_4$, and thus to equalize the current flow through each of the N-FETs $N_3$ and $N_4$. Therefore, the amplitude of the control voltage $V_{CTRL}$ is adjusted based on the gate voltage difference between the N-FET $N_3$ and N-FET $N_4$ that results from the amplitude of the control current $I_{CTRL}$, as provided by the voltage at the node 120 across the resistor $R_{GM}$. Accordingly, the control voltage $V_{CTRL}$ adjusts the activation state of the P-FET $P_3$ to modify the tail current $I_{GM1}$, and thus the transconductance of the first transconductance amplifier 102, to modify the amplitude of the control current $I_{CTRL}$ in a feedback manner. The change in the amplitude of the control current $I_{CTRL}$ thus adjusts the differential control of the differential pair of the N-FETs $N_3$ and $N_4$ to provide a steady-state of operation. Accordingly, the intermediate amplifier 106 and the first transconductance amplifier 102 are arranged in a feedback manner to modify the transconductance of the first transconductance amplifier 102.

As described previously, the circuit components of the first and second transconductance amplifiers 102 and 104 can be fabrication matched, and the P-FETs $P_3$ and $P_6$ can likewise be fabrication matched. As a result, the changes in amplitude of the control voltage $V_{CTRL}$ to change the amplitude of the tail current $I_{GM1}$ via the P-FET $P_3$ can likewise change the amplitude of the tail current $I_{GM2}$ via the P-FET $P_6$. Accordingly, the change to the transconductance of the first transconductance amplifier 102 via the amplitude of the control voltage $V_{CTRL}$ can likewise result in an approximately identical change in the transconductance of the second transconductance amplifier 104 via the amplitude of the control voltage $V_{CTRL}$. Accordingly, the second transconductance amplifier 104 can provide the differential regulation voltage $V_{REG1}$ and $V_{REG2}$ based on the voltage $V_{CM}$ relative to the predetermined reference voltage $V_{REF}$ at approximately the same transconductance as the first transconductance amplifier 102.

The operation of the transconductor circuit 100 can better be explained mathematically. The transconductance $GM_1$ of the first transconductance amplifier 102 can be expressed as follows:

$$GM_1 = I_{CTRL}/\propto V_{OUT} \qquad \text{Equation 1}$$

Where: $\propto V_{OUT}$ corresponds to the proportional relationship between the voltages $V_{OUT1}$ and $V_{OUT2}$.

The control of the first N-FET $N_3$ of the intermediate amplifier 106 can thus be expressed as follows:

$$I_{CTRL}*R_{GM} = I_1*R_5 = V_{IN}*(R_5/(R_4+R_5)) \qquad \text{Equation 2}$$

$$I_{CTRL} = V_{IN}*(R_5/(R_4+R_5))*(1/R_{GM}) \qquad \text{Equation 3}$$

Therefore, the transconductance $GM_1$ can be expressed as:

$$GM_1 = (V_{IN}/V_{OUT})*(R_5/(R_4+R_5))*(1/(\propto R_{GM})) \qquad \text{Equation 4}$$

Accordingly, as demonstrated in Equation 4, the transconductance $GM_1$ is proportional to a ratio of the input voltage $V_{IN}$ and the output voltage $V_{OUT}$. As described previously, the transconductance $GM_2$ of the second transconductance amplifier 104 is approximately equal to the transconductance $GM_1$. Accordingly, the transconductance $GM_2$ of the second transconductance amplifier 104 can be expressed as:

$$GM_2 = GM_1 = (V_{IN}/V_{OUT})*(R_5/(R_4+R_5))*(1/(\propto R_{GM})) \qquad \text{Equation 5}$$

As a result, the transconductor circuit 100 can exhibit a transconductance that is proportional to a ratio of the input voltage $V_{IN}$ and the output voltage $V_{OUT}$. As described previously, the power regulation voltage $V_{REG}$ that can be provided to the buck converter 58 that can have a control loop that is proportional to a ratio of the output voltage $V_{OUT}$ and the input voltage $V_{IN}$. For example, by implementing the transconductor circuit in the input current regulation loop, the normal dependence on $V_{OUT}$ and $V_{IN}$ can be eliminated (e.g., $V_{OUT}/V_{IN}*V_{IN}/V_{OUT}=1$). Accordingly, the control loop of the power regulator system 50 can provide power regulation that is absent a dependence on the amplitude of the input voltage $V_{IN}$ or the output voltage $V_{OUT}$ of the power regulation system 50. This allows loop gain and bandwidth to be maximized, which enhances the transient response time and mitigates potential overload on the input source. The transconductor circuit 100 further helps simplify stabilizing the power regulator system loop 50 in the presence of various critical frequencies.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A power supply circuit comprising:
   a first transconductance amplifier configured to generate a control current amplified from a first voltage and based on a first transconductance;

a second transconductance amplifier configured to generate an output signal amplified from a second voltage and based on a second transconductance;

an intermediate amplifier configured to generate a control voltage based on the control current and a third voltage, the control voltage is received by the first and second transconductance amplifiers to equalize the first transconductance and the second transconductance; and a buck converter having a voltage input terminal configured to receive the output signal, and a voltage output terminal configured to provide the first voltage.

2. The power supply circuit of claim 1, in which:
the first voltage is derived from an output voltage;
the second voltage corresponds to an amplitude of an input current; and
the third voltage is derived from an input voltage.

3. The power supply circuit of claim 1, in which the first transconductance amplifier is configured to set the first transconductance, based on the control voltage, to a ratio of the third voltage over the first voltage.

4. The power supply circuit of claim 1, in which the second transconductance amplifier is configured to set the second transconductance, based on the control voltage, to a ratio of the third voltage over the first voltage.

5. The power supply circuit of claim 1, including:
an input terminal coupled to the intermediate amplifier to provide the third voltage;
a current monitor circuit having an input coupled to the input terminal, and an output coupled to the second transconductance amplifier to provide the second voltage; and
a buck converter having an input coupled to the second transconductance amplifier to receive the output signal, and an output fed back to the first transconductance amplifier to provide the first voltage.

6. The power supply circuit of claim 1, in which the first transconductance amplifier includes a differential amplifier having:
a first input coupled to receive a first portion of the first voltage;
a second input coupled to receive a second portion of the first voltage;
a controlled current source having a control terminal coupled to receive the control voltage; and
an output configured to deliver the control current.

7. The power supply circuit of claim 6, in which the controlled current source is configured to adjust the first transconductance to approximate the second transconductance based on the control voltage.

8. The power supply circuit of claim 1, in which the second transconductance amplifier includes a differential amplifier having:
a first input coupled to receive a reference voltage;
a second input coupled to receive the second voltage;
a controlled current source having a control terminal coupled to receive the control voltage; and
an output configured to deliver the output signal.

9. The power supply circuit of claim 8, in which the controlled current source is configured to adjust the second transconductance to approximate the first transconductance based on the control voltage.

10. The power supply circuit of claim 1, in which the intermediate amplifier includes:
a conductive path to receive the control current; and
a differential amplifier having:
a first input coupled to the conductive path;
a second input coupled to receive a portion of the third voltage; and
an output configured to deliver the control voltage.

11. A power supply circuit comprising:
a first transconductance amplifier configured to generate a control current amplified from an output voltage and based on a first transconductance;
a second transconductance amplifier configured to generate a regulation signal amplified from a sensed voltage proportional to an input current and based on a second transconductance;
an intermediate amplifier configured to generate a control voltage based on the control current and an input voltage; and
a buck converter having a voltage input terminal configured to receive the regulation signal, and a voltage output terminal configured to provide the output voltage,
in which the first and second transconductance amplifiers are configured to adjust the first and second transconductance based on the control voltage.

12. The power supply circuit of claim 11, in which:
the first transconductance amplifier includes a first controlled current source configured to adjust, based on the control voltage, the first transconductance to approximate the second transconductance; and
the second transconductance amplifier includes a second controlled current source configured to adjust, based on the control voltage, the second transconductance to approximate the first transconductance.

13. The power supply circuit of claim 11, in which the intermediate amplifier includes:
a conductive path to receive the control current; and
a differential amplifier having:
a first input coupled to the conductive path;
a second input coupled to receive a portion of the input voltage; and
an output configured to deliver the control voltage.

14. The power supply circuit of claim 11, in which the first transconductance amplifier is configured to set the first transconductance to a ratio of the input voltage over the output voltage.

15. The power supply circuit of claim 11, in which the second transconductance amplifier is configured to set the second transconductance to a ratio of the input voltage over the output voltage.

16. A power supply circuit comprising:
a first transconductance amplifier having a first controlled current source configured to adjust a first transconductance based on a control voltage, the first transconductance amplifier configured to generate a control current by amplifying an output voltage with the first transconductance;
a second transconductance amplifier having a second controlled current source configured to adjust a second transconductance based on the control voltage, the second transconductance amplifier configured to generate a regulation signal by amplifying a sensed voltage proportional to an input current with the second transconductance;
an intermediate amplifier configured to generate the control voltage based on the control current and an input voltage; and
a buck converter having a voltage input terminal configured to receive the regulation signal, and a voltage output terminal configured to provide the output voltage.

17. The power supply circuit of claim 16, including:
an input terminal coupled to the intermediate amplifier to provide the input voltage;
a current monitor circuit having an input coupled to the input terminal, and an output coupled to the second transconductance amplifier to provide the sensed voltage; and
a buck converter having an input coupled to the second transconductance amplifier to receive the regulation signal, and an output fed back to the first transconductance amplifier to provide the output voltage.

18. The power supply circuit of claim 16, in which the first controlled current source is configured to adjust the first transconductance to a ratio of the input voltage over the output voltage.

19. The power supply circuit of claim 16, in which the second controlled current source is configured to adjust the second transconductance to a ratio of the input voltage over the output voltage.

20. The power supply circuit of claim 16, in which the intermediate amplifier includes:
a conductive path to receive the control current; and
a differential amplifier having:
a first input coupled to the conductive path;
a second input coupled to receive a portion of the input voltage; and
an output configured to deliver the control voltage.

21. The power supply circuit of claim 1 including:
rectifier circuitry having an alternating current voltage input and a direct current voltage output coupled to the third voltage of the intermediate amplifier; and
current monitor circuitry having an input coupled to the direct current voltage output and having a current monitor voltage output coupled to the second voltage of the second transconductance amplifier.

22. The power supply circuit of claim 11 including:
rectifier circuitry having an alternating current voltage input and a direct current voltage output coupled to the input voltage of the intermediate amplifier; and
current monitor circuitry having an input coupled to the direct current voltage output and having a current monitor voltage output coupled to the sensed voltage of the second transconductance amplifier.

23. The power supply circuit of claim 16 including:
rectifier circuitry having an alternating current voltage input and a direct current voltage output coupled to the input voltage of the intermediate amplifier; and
current monitor circuitry having an input coupled to the direct current voltage output and having a current monitor voltage output coupled to the sensed voltage of the second transconductance amplifier.

24. A power supply circuit having a high voltage rail and a low voltage rail, comprising:
a direct current voltage input;
converter circuitry having a regulated voltage input and a voltage output; and
a transconductor circuit including:
a first transconductance amplifier having an input coupled to the voltage output, having a first control voltage input and having a control current output, the first transconductance amplifier having a first transconductance;
a second transconductance amplifier having a reference voltage input, having a current monitor voltage input coupled to the direct current voltage input, having a second control voltage input, and having a regulated voltage output coupled to the regulated voltage input, the second transconductance amplifier having a second transconductance; and
an intermediate amplifier having an input coupled to the direct current voltage input, having an input coupled to the control current output, and having a control voltage output coupled to the first control voltage input and the second control voltage input.

25. The power supply circuit of claim 24 in which the transconductance circuit has a transconductance proportional to an input voltage on the direct current voltage input and an output voltage on the voltage output.

26. The power supply circuit of claim 24 in which the first transconductance amplifier and the second transconductance amplifier have circuit components that are fabrication matched.

27. The power supply of claim 24 in which the control voltage output provides a control voltage to result in an approximately identical change in the first transconductance and the second transconductance.

28. The power supply circuit of claim 24 including a feedback loop between the first transconductance amplifier and the intermediate amplifier, the feedback loop including the control current output and the control voltage input.

29. The power supply of claim 24 in which the transconductor circuit includes current monitor circuitry having an input coupled to the direct current voltage input and a current monitor voltage output coupled to the current monitor voltage input.

30. The power supply of claim 24 in which the first transconductance amplifier includes a first control transistor and a first differential pair of transistors coupled between the high voltage rail and the low voltage rail, the first control transistor having a gate coupled to the first control voltage input, the first differential pair of transistors having a gate coupled to the voltage output input and having a drain coupled to the control current output.

31. The power supply of claim 24 in which the second transconductance amplifier includes a second control transistor and a second differential pair of transistors coupled between the high voltage rail and the low voltage rail, the second control transistor having a gate coupled to the second control voltage input, the second differential pair of transistors having a gate coupled to the reference voltage input, having a gate coupled to the current monitor voltage input, and having a drain coupled to the regulated voltage output.

32. The power supply of claim 31 in which the second differential pair of transistors have drains coupled to differential first and second regulated voltage outputs.

33. The power supply of claim 24 in which the intermediate amplifier is a voltage amplifier having a pair of common gate connected transistors, a control voltage node, and a third differential pair of transistors coupled between the high voltage rail and the low voltage rail, the third differential pair of transistors having a gate coupled to the control current output, and the control node being coupled to the control voltage output.

34. The power supply circuit of claim 24 in which the converter circuitry is buck converter circuitry.

* * * * *